US012769375B2

(12) United States Patent
Chien et al.

(10) Patent No.: US 12,769,375 B2
(45) Date of Patent: Oct. 20, 2026

(54) QUICK DISASSEMBLY STRUCTURE FOR COMPUTER CASE

(71) Applicant: Elitegroup Computer Systems Co., Ltd., Taipei City (TW)

(72) Inventors: Shih-Hao Chien, Taipei City (TW); Wei-Ting Ying, Taipei City (TW); Guan-Yu Chen, Taipei City (TW)

(73) Assignee: Elitegroup Computer Systems Co., Ltd., Taipei City (TW)

(*) Notice: Subject to any disclaimer, the term of this patent is extended or adjusted under 35 U.S.C. 154(b) by 38 days.

(21) Appl. No.: 19/056,793

(22) Filed: Feb. 19, 2025

(65) Prior Publication Data

US 2026/0023412 A1 Jan. 22, 2026

Related U.S. Application Data

(60) Provisional application No. 63/673,204, filed on Jul. 19, 2024.

(51) Int. Cl.

| | |
|---|---|
| ***H05K 5/02*** | (2006.01) |
| ***E05C 1/14*** | (2006.01) |
| ***G06F 1/16*** | (2006.01) |
| ***G06F 1/18*** | (2006.01) |

(52) U.S. Cl.

CPC ................ *G06F 1/181* (2013.01); *E05C 1/14* (2013.01); *H05K 5/0221* (2013.01); *G06F 1/182* (2013.01)

(58) Field of Classification Search

CPC ............ G06F 1/181; G06F 1/182; E05C 1/14; H05K 5/0221

See application file for complete search history.

(56) References Cited

U.S. PATENT DOCUMENTS

| | | | | |
|---|---|---|---|---|
| 5,732,000 A * | 3/1998 | Chiesi | G06F 1/181 | 361/679.57 |
| 7,492,576 B2 * | 2/2009 | Lin | G06F 1/181 | 361/679.37 |
| 2007/0206348 A1 * | 9/2007 | Lin | G06F 1/181 | 361/727 |
| 2010/0223761 A1 * | 9/2010 | Chen | G06F 1/181 | 24/1 |
| 2011/0234068 A1 * | 9/2011 | Chang | G06F 1/181 | 312/309 |

* cited by examiner

*Primary Examiner* — Kimberley S Wright

(74) *Attorney, Agent, or Firm* — WPAT, PC

(57) ABSTRACT

The present application discloses a quick disassembly structure for computer case, comprising: a first casing, a quick disassembly member, and a second casing. The quick disassembly member further includes a toggle pin component, a sliding plate, and an elastic component. A sliding limit groove of the sliding plate corresponds to a limit fastener of the first casing, a transmission plate of the sliding plate corresponds to a toggle extension member of the toggle pin component, and the elastic component is fixed to a first hook part of the first casing and a second hook part of the sliding plate, enabling a tenon of the second casing engaging with a third hook part of the sliding plate. Overcoming the issue of a conventional quick disassembly structure for computer case where the lateral push button cannot be moved for separating the first and second casings due to aging or damage, increased friction.

11 Claims, 10 Drawing Sheets

QUICK DISASSEMBLY STRUCTURE FOR COMPUTER CASE

FIELD OF THE INVENTION

The present application relates to a quick disassembly structure, particularly to a quick disassembly structure for computer case.

BACKGROUND OF THE INVENTION

A quick disassembly structure is referred to a mechanical structure design in capable of quickly disassembled and reassembled, typically applied for equipment or tools that require frequent installation and disassembly. The purpose of this design is to enhance operational efficiency, reduce assembly and disassembly time, and minimize the need for tools or specialized skills.

Initially, computers that entered homes and schools were known as desktop computers, generally comprising components, such as a monitor, a motherboard, a central processing unit (CPU), a graphics card, a sound card, a power supply, an optical drive, a hard disk drive, a keyboard and so on. Following the invention of laptops, which offered the convenience of portability, they gradually replaced some of the desktop computers used in homes or workplaces. However, those with stricter requirements for computer component specifications continued to use desktop computers, seeking better performance, and subsequently, even mini-computers emerged with smaller volumes.

Mini-computers are one type of desktop computers, in similar size to modems, and occupy less space compared to traditional desktop computers. Their motherboards generally equip with low-power-consumption processors, display chips, memory, etc., and their operating systems can comprise macOS, Windows, Google, and various other installable software.

Compared to desktop computers, mini-computers have the disadvantage of poorer heat dissipation and fewer options for hardware upgrades. However, aside from these drawbacks, the performance gap between their internal components, such as processors, and those of typical desktop computers has gradually decreased, leading some consumers to replace their larger desktop computers with mini-computers.

Mini computers are inconvenient for hardware upgrades, cooling, and cleaning compared to larger desktop computers. Therefore, users need to disassemble the mini computer's casing to perform necessary upgrades or fan cleaning. At home, there are usually tools available for disassembling mini computers, such as screwdrivers. However, most users do not carry these tools outside, or the tools at home may not fit, making it impossible to open the mini computer's casing for internal hardware replacement or fan cleaning. This brings considerable inconvenience to users who need to perform timely hardware replacements or cleaning, thus necessitating a casing that can be disassembled without tools.

However, a conventional computer casing with a quick disassembly structure utilizes a lateral toggle driven by the quick disassembly structure to achieve the opening and closing actions of the second casing's quick disassembly. But, when toggling the lateral toggle, increased friction can prevent the toggle structure from moving, thus preventing the second casing from disassembling. Additionally, after disassembling the second casing using the quick disassembly structure, the second casing is completely disassembled, posing alignment issues for users when reattaching it.

In light of the aforementioned issues with known technology, the present application provides a quick disassembly structure for computer case, comprising a first casing, quick disassembly components, and a second casing. The present application's quick disassembly structure for computer case is designed to solve the problem where the lateral toggle of the quick disassembly structure in computer casings with a quick disassembly structure cannot move due to increased friction, thus preventing the first and second casings from disassembling.

SUMMARY OF THE INVENTION

An objective of the present application is to provide a quick disassembly structure for computer case, comprising a first casing, a quick disassembly member, and a second casing. The quick disassembly member further includes a toggle member, a sliding plate, and an elastic component. This structure overcomes the issue in the computer case with a quick disassembly structure where the lateral toggle cannot move for disassembling the first and second casings due to aging or damage leading to increased friction.

To achieve above objective, the present application provides a quick disassembly structure for computer case, which comprises a first casing, a quick disassembly member, and a second casing. The first casing comprises a cover, a first casing fastener, and a limit fastener. The cover is perforated, the first casing fastener is fixed with a first hook part and a pivot shaft, a limit fixing groove surrounding a side of the limit fastener. The quick disassembly member includes: a toggle pin component, a sliding plate, and an elastic component. The toggle pin component comprises a toggle pin component body, a pivot hole, and a toggle extension member. The sliding plate comprises a sliding plate body, a sliding limit groove, a second hook part, a transmission plate, and a third hook part. The second casing includes a tenon.

The present application further provides an embodiment, wherein when the toggle extension member is moved by rotating of clockwise around the pivot hole as a rotating axis, driving the toggle extension member pushing the transmission plate to move toward a first direction. Simultaneously, as the toggle extension member pushes the transmission plate, the second hook part pulls and stretches the elastic component, and the third hook part moves toward the first direction to disengage from the tenon.

The present application further provides an embodiment, wherein after the third hook part moves toward the first direction to disengage from the tenon, the first casing and the quick disassembly member separate from the second casing toward a second direction.

The present application further provides an embodiment, wherein when the first casing and the quick disassembly member separate from the second casing toward the second direction, the toggle pin component is used to pull the first casing towards the second direction.

The present application further provides an embodiment, wherein the top surface of the first casing includes a corner pillar, used to support a mini-computer.

The present application further provides an embodiment, wherein the material of the sliding plate is a steel plate treated by a hot-dip galvanizing treatment.

The present application further provides an embodiment, wherein a side of the third hook part includes a slanted opening, used to dispose the third hook part aligned with the tenon for hooking when the first casing and the quick disassembly member engage with the second casing toward a opposite direction of the second direction.

The present application further provides an embodiment, wherein after the third hook part is aligned with the tenon for hooking, the toggle pin component rotates counterclockwise around the pivot hole as a rotating axis, while the elastic component shrinks, causing the third hook part hooking to the tenon.

The present application further provides an embodiment, wherein another side of the second casing is fixed with a second casing fastener, a side of the second casing fastener is fixed with a sleeve, a side of the cover is fixed with a shaft, and the sleeve is fitted over the shaft.

The present application further provides an embodiment, wherein the material of the second casing fastener or sleeve is plastic.

DETAILED DESCRIPTION OF THE INVENTION

Figure 1A:
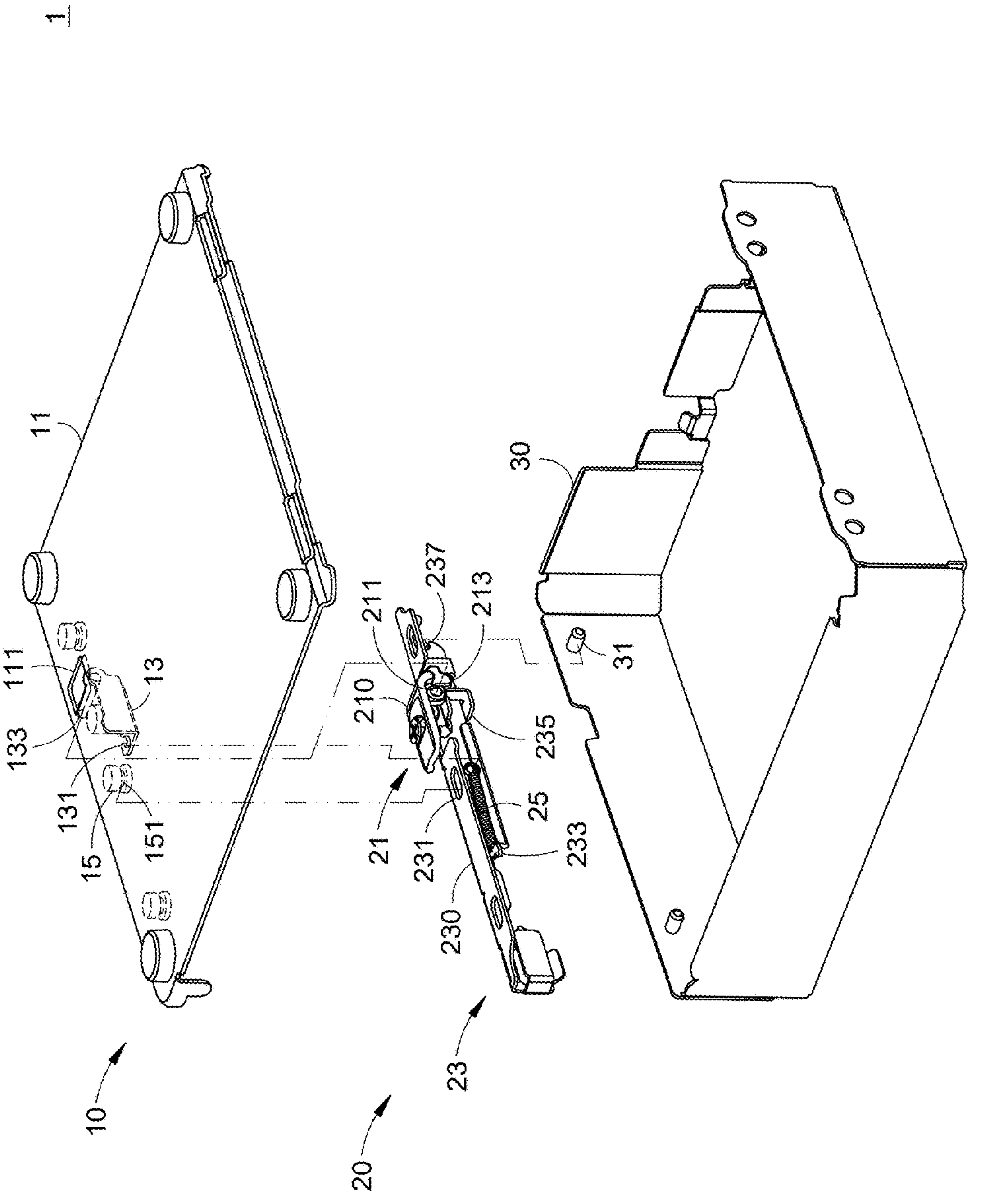
FIG. 1A which is a structure exploded view according to an embodiment of the present application.

To clarify the objectives, technical solutions, and advantages of this application, the following detailed description is provided in conjunction with specific embodiments and accompanying drawings. It should be understood that these descriptions are merely illustrative and are not intended to limit the scope of this application. Furthermore, descriptions of well-known structures and technologies are omitted in the following description to avoid unnecessarily obscuring the concepts of the application.

The accompanying drawings illustrate a layered structural diagram according to an embodiment of this application. These drawings are not drawn to scale, wherein certain details have been enlarged for clarity, and some details may have been omitted. The shapes, relative sizes, and positional relationships of various regions and layers shown in the drawings are exemplary only. Actual variations may occur due to manufacturing tolerances or technical limitations, and those skilled in the art may design regions/layers with different shapes, sizes, and relative positions as required.

Clearly, the described embodiments are only part of the embodiments of this application, not all embodiments. Based on the embodiments in this application, all other embodiments obtained by those of ordinary skill in the art without inventive steps fall within the scope of this application.

In the description of this application, it should be noted that the terms “first,” “second,” and “third” are used solely for descriptive purposes and should not be construed as indicating or implying relative importance.

Furthermore, the technical features involved in the different embodiments of this application described below may be combined with each other as long as they do not conflict.

A conventional computer case with a quick disassembly structure may encounter increased friction due to aging or damage of the lateral release button, leading the button structure immovable for the separation of the first and second casings.

In light of the aforementioned issues with known technology, the present application provides a quick disassembly structure for computer case, comprising a first casing, a quick disassembly member, and a second casing. The quick disassembly member further comprises a release component, a sliding plate, and an elastic component. The present application aims to solve the problem of increased friction in the lateral release button of computer cases with known quick disassembly structures, leading the button structure immovable for the separation of the first and second casings.

Figure 2A:
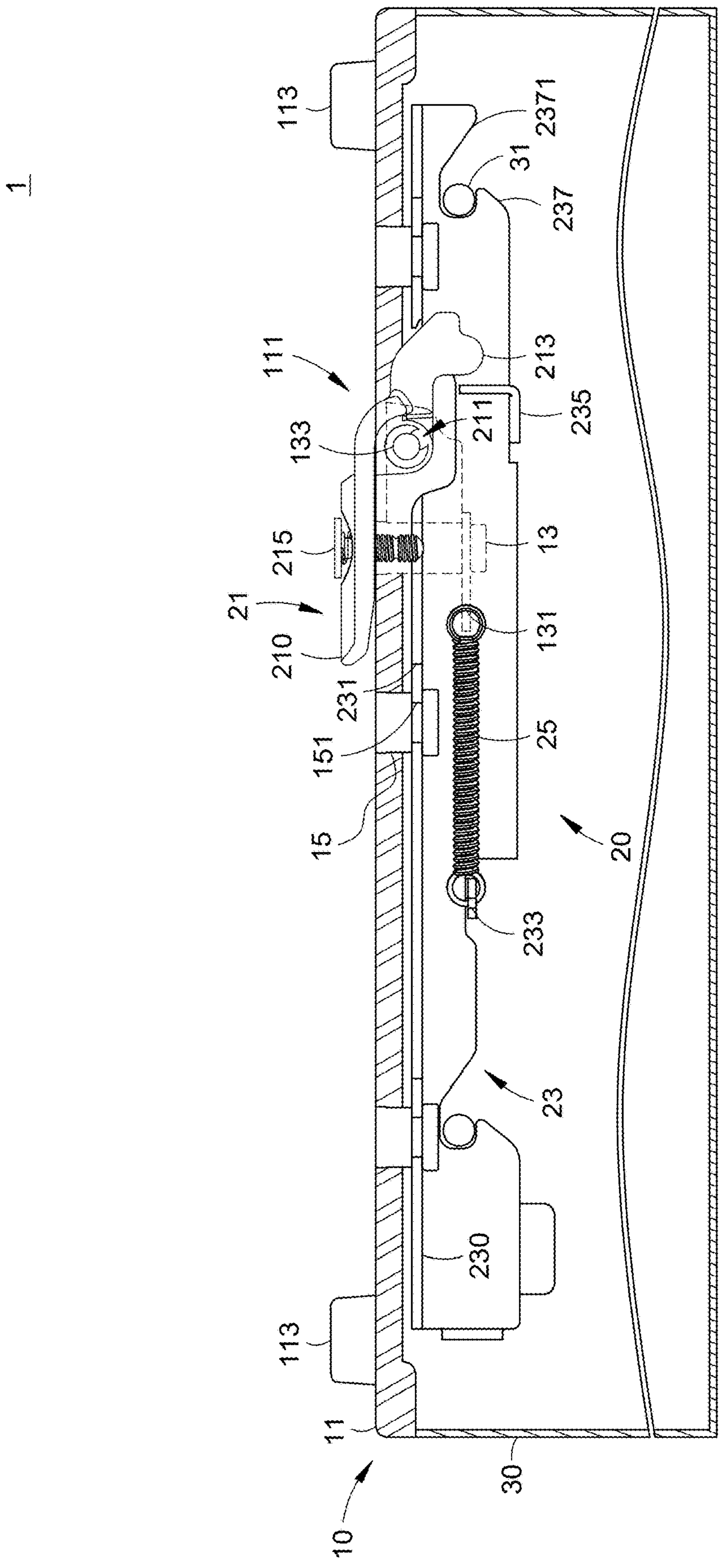
FIG. 2A to FIG. 2C which are right side sectional views of FIG. 1A and schematic diagrams of operating according to an embodiment of the present application.

Please refer to FIG. 1A and FIG. 2A, where FIG. 1A is a structure exploded view according to an embodiment of the present application, and FIG. 2A is a right side sectional view and operational schematic according to an embodiment of the present application. As illustrated, this embodiment is the first embodiment, a quick disassembly structure for a computer case, the computer case 1 includes a first casing 10, a quick disassembly member 20, and a second casing 30.

Continued to the above, in this embodiment, the first casing 10 includes a cover 11, a first casing fastener 13, and a limit fastener 15, and the cover 11 includes a hole 111, passing through on a top surface of the cover 11.

Continued to the above, in this embodiment, the first casing fastener 13 is fixed to a bottom surface of the cover 11 and adjacent to the hole 111. The first casing fastener 13 further includes a first hook part 131 and a pivot shaft 133, where the first hook part 131 is fixed to a side of the first casing fastener 13, and the pivot shaft 133 protrudes from another side of the first casing fastener 13 and is disposed below the hole 111.

Continued to the above, in this embodiment, the limit fastener 15 is disposed adjacent to a side of the first hook part 131, with a limit fixing groove 151 surrounding a side of the limit fastener 15.

Continued to the above, in this embodiment, the quick disassembly structure 20 includes a toggle pin component 21, a sliding plate 23, and an elastic component 25, wherein a side of the toggle pin component 21 is inserted through the hole 111.

Continued to the above, in this embodiment, the toggle pin component 21 further includes a toggle pin component body 210, a pivot hole 211, and a toggle extension member 213. The pivot hole 211 is disposed on a side of the toggle pin component body 210 and is pivoted to the pivot shaft 133, while the toggle extension member 213 is adjacent to the pivot hole 211 and extends from that the side of the toggle pin component body 210.

Continued to the above, in this embodiment, the sliding plate 23 is disposed adjacent to a bottom surface of the cover 11, and includes a sliding plate body 230, a sliding limit groove 231, a second hook part 233, a transmission plate 235, and a third hook part 237.

Continued to the above, in this embodiment, the sliding limit groove 231 is passed through a top surface of the sliding plate body 230. A width of the sliding limit groove 231 corresponds to the diameter of the limit fixing groove 151 surrounded the limit fixing component 15, allowing the sliding limit groove 231 to slide onto the limit fixing component 15.

Continued to the above, in this embodiment, the second hook part 233 is disposed on a side of the sliding plate body 230.

Continued to the above, in this embodiment, the transmission plate 235 is extended and fixed to the side of the sliding plate body 230, and the transmission plate 235 is disposed corresponding to the toggle extension member 213.

Continued to the above, in this embodiment, the third hook part 237 is adjacent to the transmission plate 235 and is fixed to the side of the sliding plate body 230.

Continued to the above, in this embodiment, an end of the elastic component 25 is hooked by the first hook part 131, and another end of the elastic component 25 is hooked by the second hook part 233.

Continued to the above, in this embodiment, the first hook part 131 is horizontally aligned with the second hook part 233.

Continued to the above, in this embodiment, a tenon 31 is set on a side of the second casing 30 corresponding to the third hook part 237.

Continued to the above, in this embodiment, a pin fastener 215 is inserted through a top surface of the toggle pin component 21. When the pin fastener 215 is locked, the toggle pin component 21 cannot be toggled outward from the first casing 10.

Continued to the above, in this embodiment, a corner pillar 113 is disposed on the top surface of the first casing 10. When the third hook part 237 engages with the tenon 31, the corner pillar 113 is used to support the computer case 1.

Continued to the above, in this embodiment, the material of the sliding plate 23 is a steel plate treated by a hot-dip galvanizing treatment.

Figure 2B:
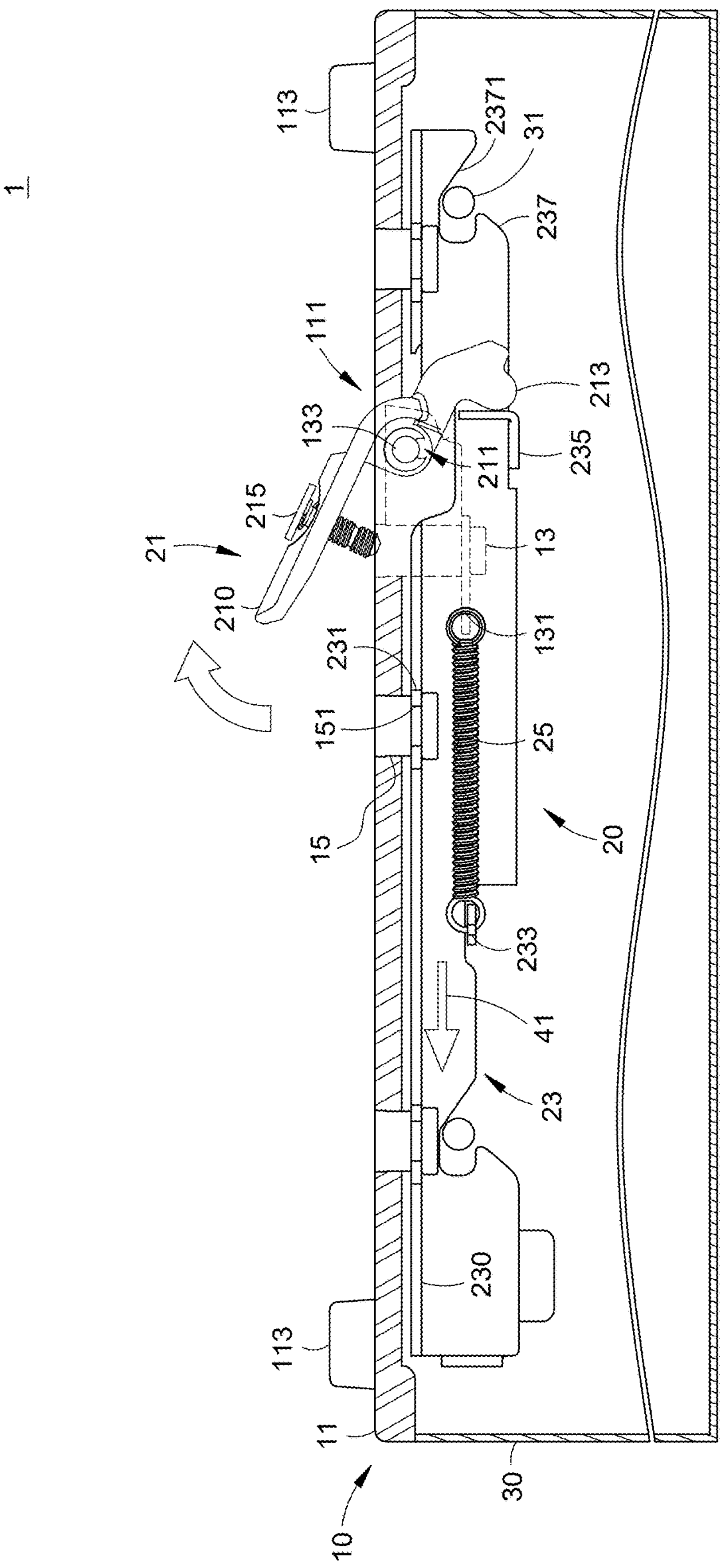
Figure 2C:
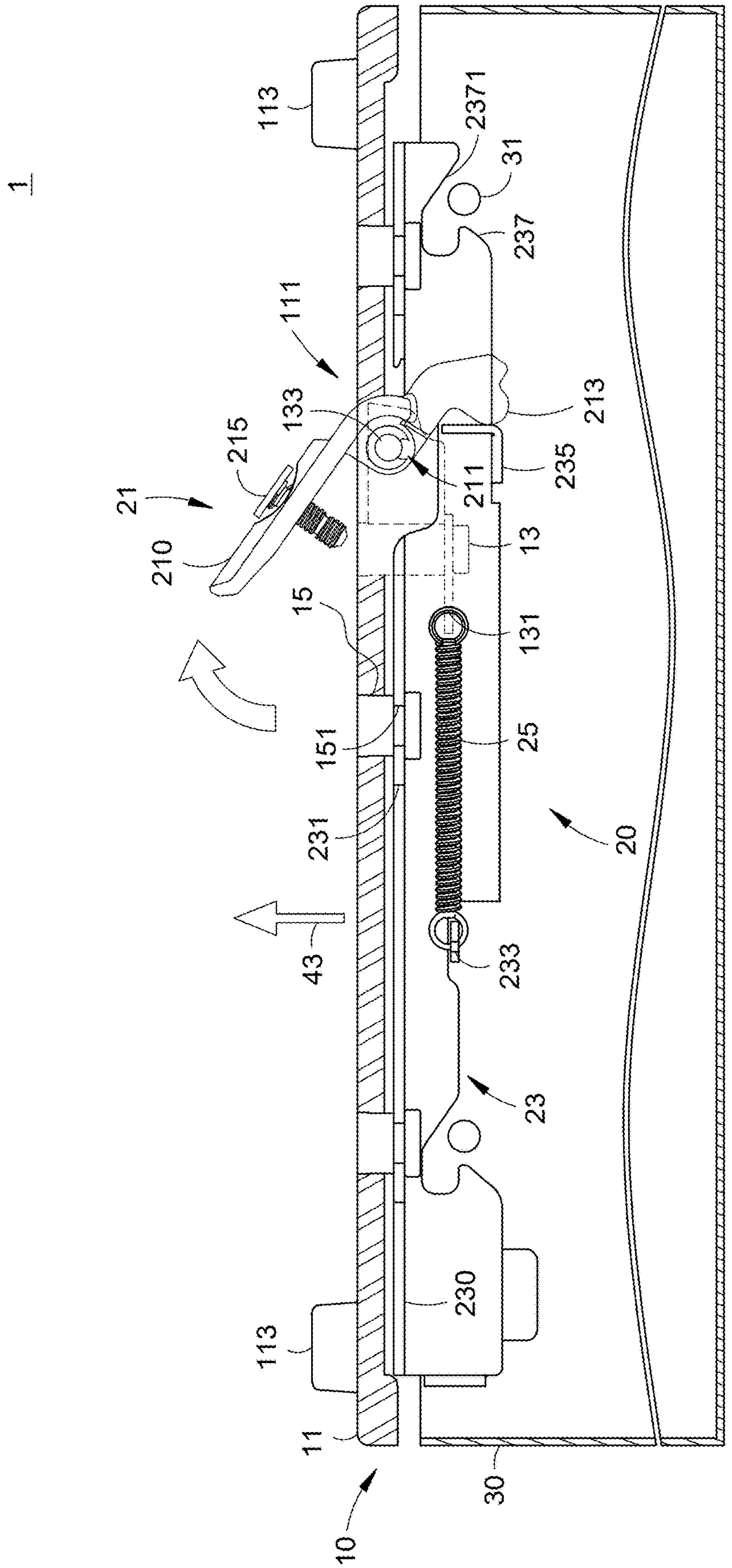

Please refer again to FIG. 2A, FIG. 2B, and FIG. 2C. FIG. 2A to FIG. 2C are the right side sectional views of FIG. 1A and operational schematic diagrams according to an embodiment of the present application. As shown in the figures, in this embodiment, when the toggle pin component 21 is actuated, it rotates clockwise around the pivot hole 211, driving the toggle extension member 213, which in turn pushes the transmission plate 235 to move in a first direction 41.

Continued to the above, in this embodiment, as the toggle extension member 213 pushes the transmission plate 235, the limit fixing component 15 slides from the left side of the sliding limit groove 231 to the right side of the sliding limit groove 231. The second hook part 233 pulls and stretches the elastic component 25 toward the first direction 41, and the third hook part 237 disengages from the tenon 31 toward the first direction 41.

Continued to the above, in this embodiment, after the third hook part 237 disengages from the tenon 31 in the first direction 41, the first casing 10 and the quick disassembly member 20 separate from the second casing 30 in a second direction 43.

Continuing from the above, in this embodiment, the toggle pin component 21 is used to pull the first casing 10 and the quick disassembly member 20 to separate from the second casing 30 in the second direction 43.

Continued to the above, in this embodiment, a slanted opening 2371 is set on a side of the third hook part 237. When the first casing 10 and the quick disassembly member 20 engage the second casing 30 toward a opposite direction of the second direction 43, the slanted opening 2371 facilitates the alignment of the third hook part 237 with the tenon 31 for hooking the tenon 31.

Continued to the above, in this embodiment, when the first casing 10 and the quick disassembly structure 20 are engaged with the second casing 30 toward the opposite direction of the second direction 43, and after the third hook part 237 is set corresponding to the tenon 31, the dial member 21 rotates counterclockwise around the pivot hole 211 as the axis.

Continued to the above, in this embodiment, when the dial member 21 rotates counterclockwise with the pivot hole 211 as the axis, it simultaneously drives the toggle extension member 213 to rotate counterclockwise around the pivot hole 211 as the axis, causing the toggle extension member 213 to no longer push the transmission plate 235.

Continued to the above, in this embodiment, when the toggle extension member 213 no longer pushes the transmission plate 235, the elastic component 25 causes the second hook part 233 to shrink toward a opposite direction of the first direction 41, and causes the third hook part 237 to engage with the tenon 31.

Figure 3:
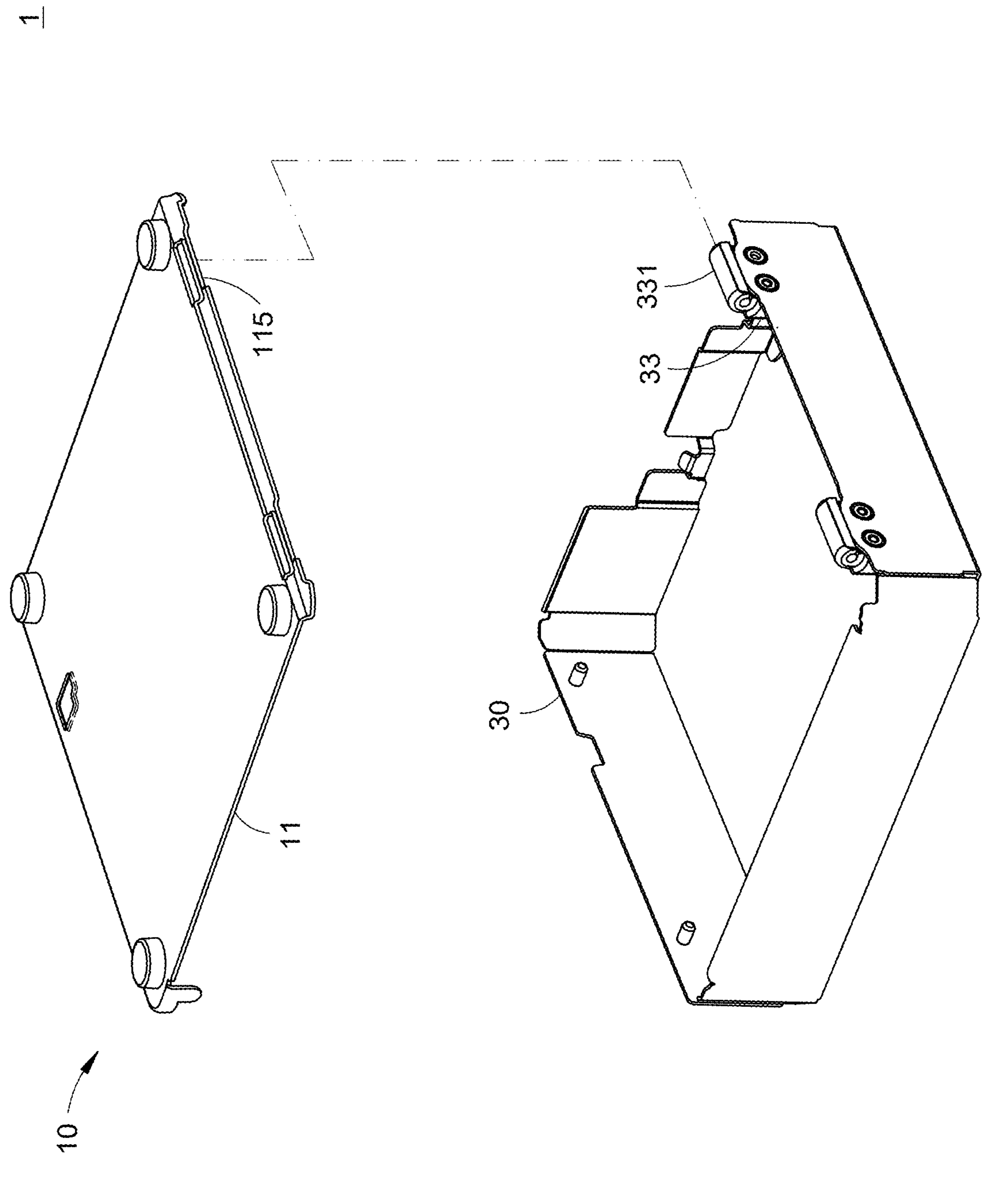
FIG. 3 which is a schematic diagram of the second casing fastener according to an embodiment of the present application.

Please refer to FIG. 3, which is a schematic diagram of the second casing fastener according to an embodiment of the present application. As shown in the figure, in this embodiment, a side of the cover body 11 is fixed with a shaft part 115, and another side of the second casing 30 is fixed with a second casing fastener 33. A side of the second casing fastener 33 is fixed with a sleeve 331, which is protruding on a top side of the second casing 30, and the sleeve 331 is used to accommodate the shaft part 115.

Continued to the above, in this embodiment, the length of the sleeve 331 corresponds to the length of the shaft part 115.

Continued to the above, in this embodiment, the material of the second casing fastener 33 or the sleeve 331 is plastic.

Figure 4A:
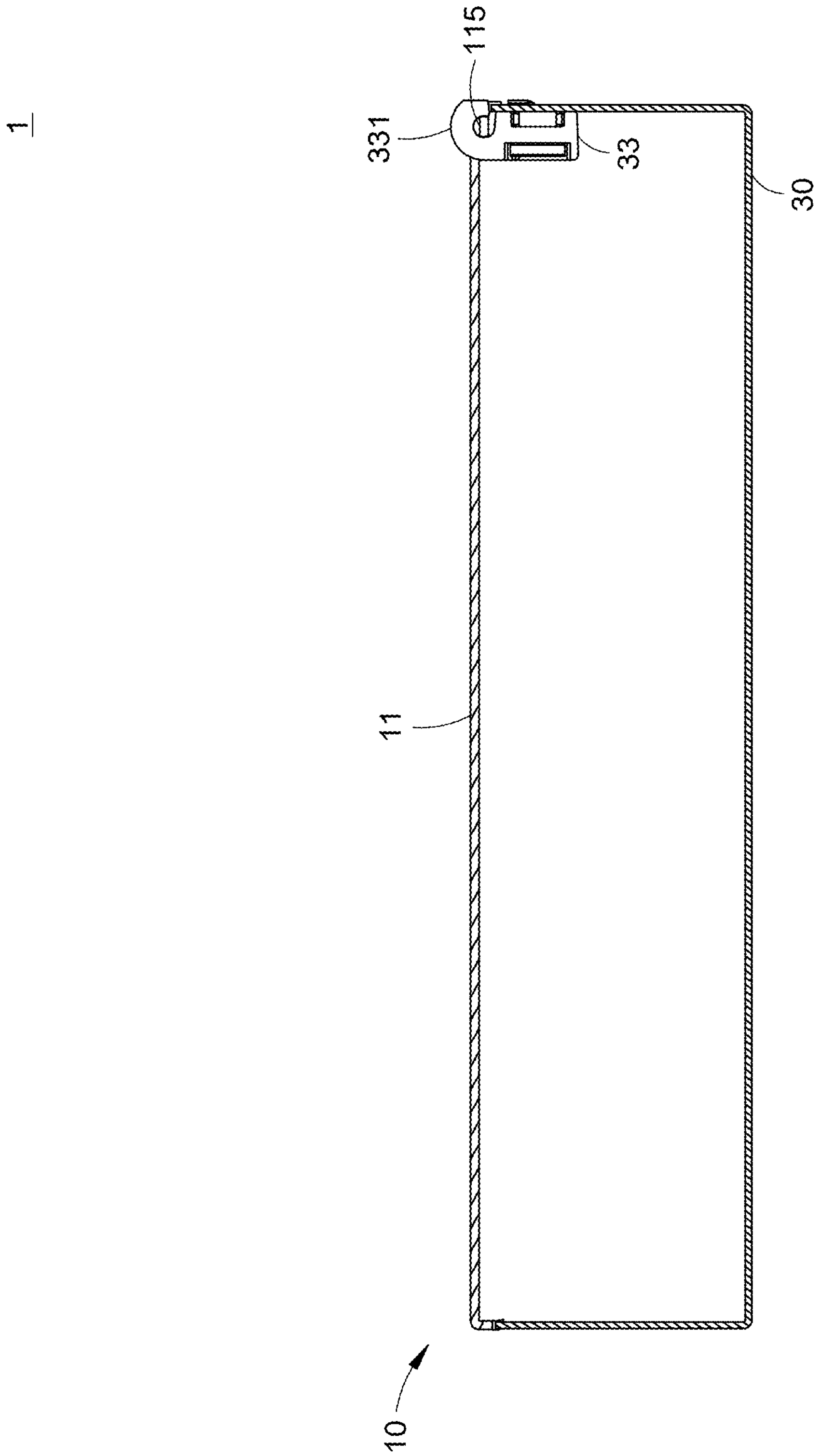
FIG. 4A to FIG. 4B, and FIG. 5A to FIG. 5B which is a front side sectional view of FIG. 3 and a schematic diagram of operating according to an embodiment of the present application.
Figure 4B:
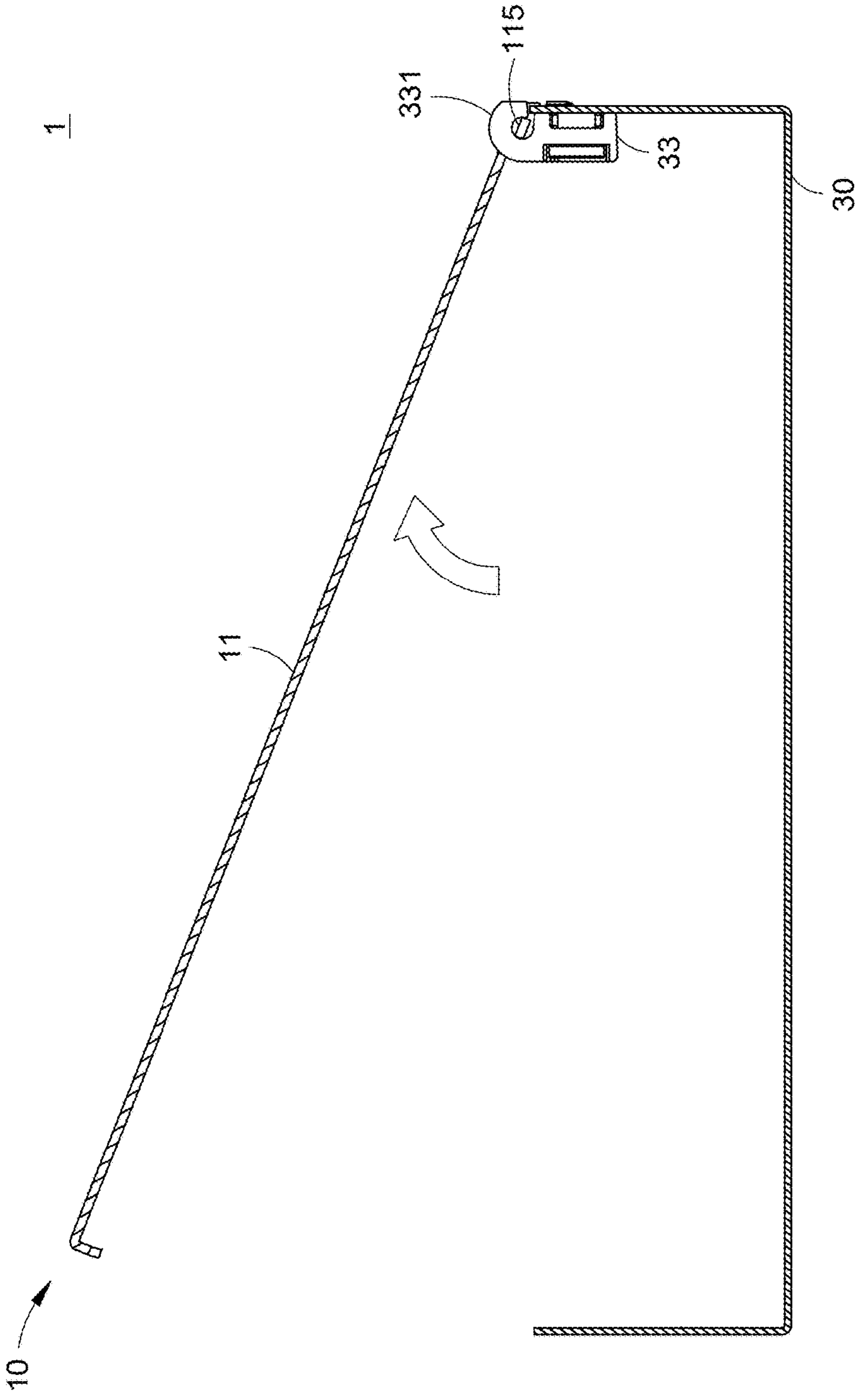

Please refer to FIG. 4A and FIG. 4B, which are the sectional views of FIG. 3 and the operational schematic diagrams according to an embodiment of the present application. As shown in the figures, in this embodiment, when the cover body 11 separates from the second casing 30, the shaft part 115 rotates inside the sleeve 331, causing the first casing 10 to rotate clockwise around the shaft part 115 as a rotating axis and disengage from the second casing 30.

Continued to the above, in this embodiment, when the cover body 11 engages with the second casing 30, the shaft part 115 rotates inside the sleeve 331, causing the first casing 10 to rotate counterclockwise around the shaft part 115 and engage with the second casing 30.

Figure 5A:
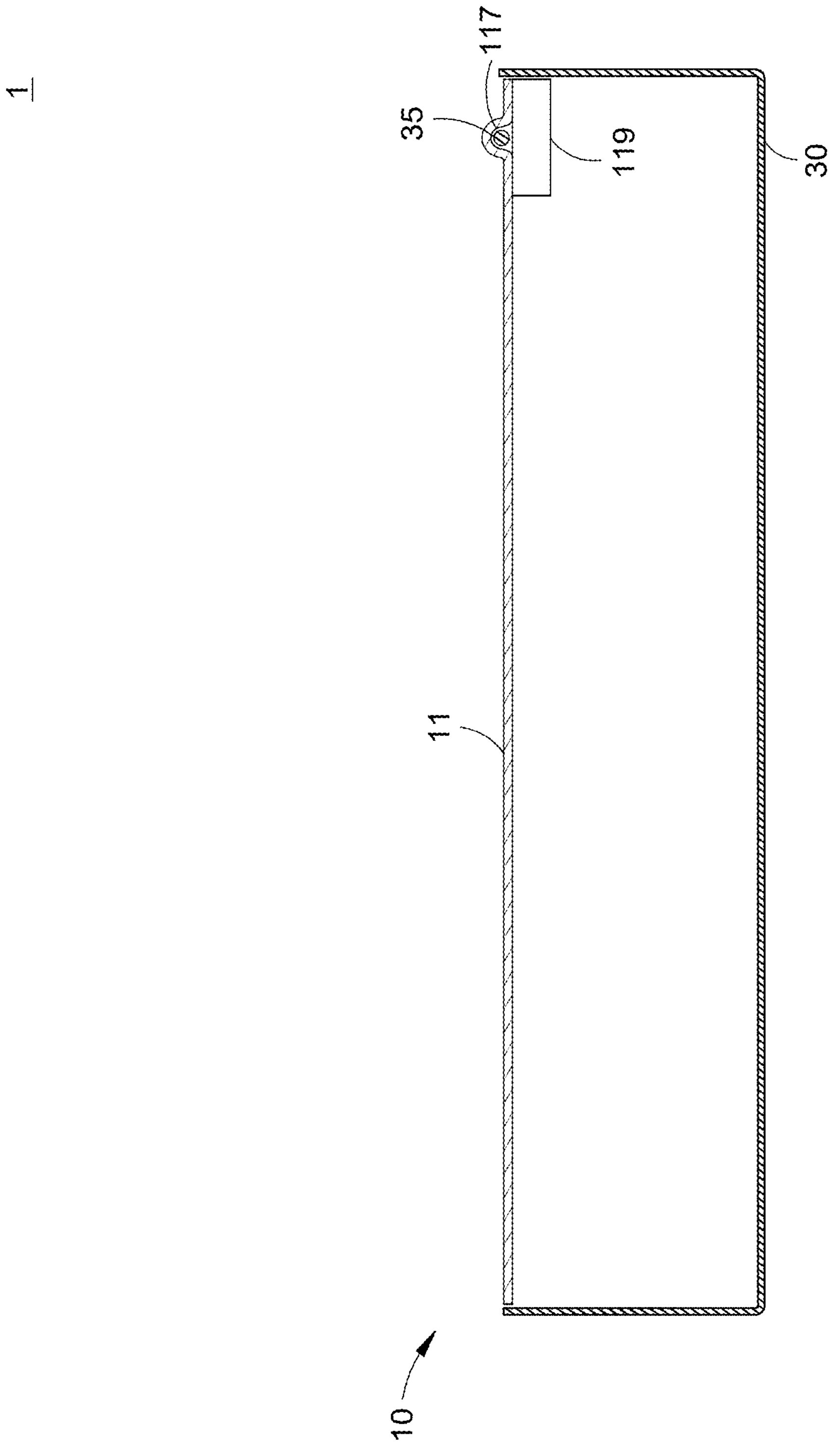
Figure 5B:
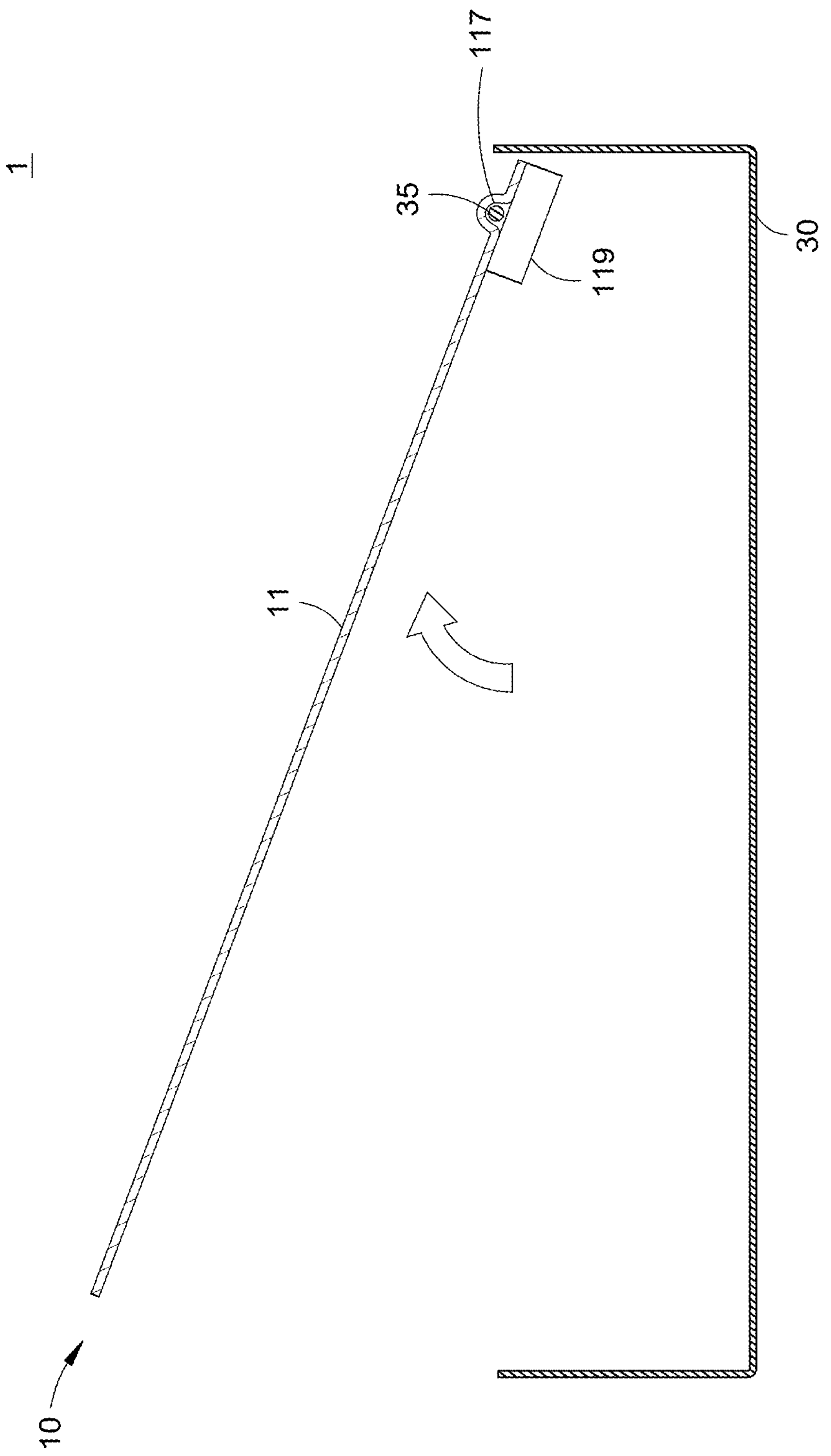

Please refer to FIG. 5A and FIG. 5B, which are the cross-sectional views prior to FIG. 3 and the operational schematic according to an embodiment of the present application. As shown in the figures, in this embodiment, another side of the second casing 30 is fixed with a second casing shaft component 35. A cover sleeve 117 is disposed on the side of the cover body 11, and a cover fixing component 119 is fixed on one bottom surface of the cover body 11. The cover fixing component 119 is aligned with the cover sleeve 115. The cover sleeve 117 is fitted over the second casing shaft component 35, and the cover sleeve 117 rotates around the second casing shaft component 35 as the axis, causing the first casing 10 to rotate clockwise around the second casing shaft component 35 and separate from the second casing 30.

Continued to the above, in this embodiment, the cover fixing component 119 is fixed to the bottom surface of the cover body 11 by means of screws, snap-fitting, or adhesion.

Continued to the above, in this embodiment, when the cover body 11 engages with the second casing 30, the cover sleeve 117 rotates around the second casing shaft component 35 as the axis, causing the first casing 10 to rotate counterclockwise around the second casing shaft component 35 and engage with the second casing 30.

Figure 1B:
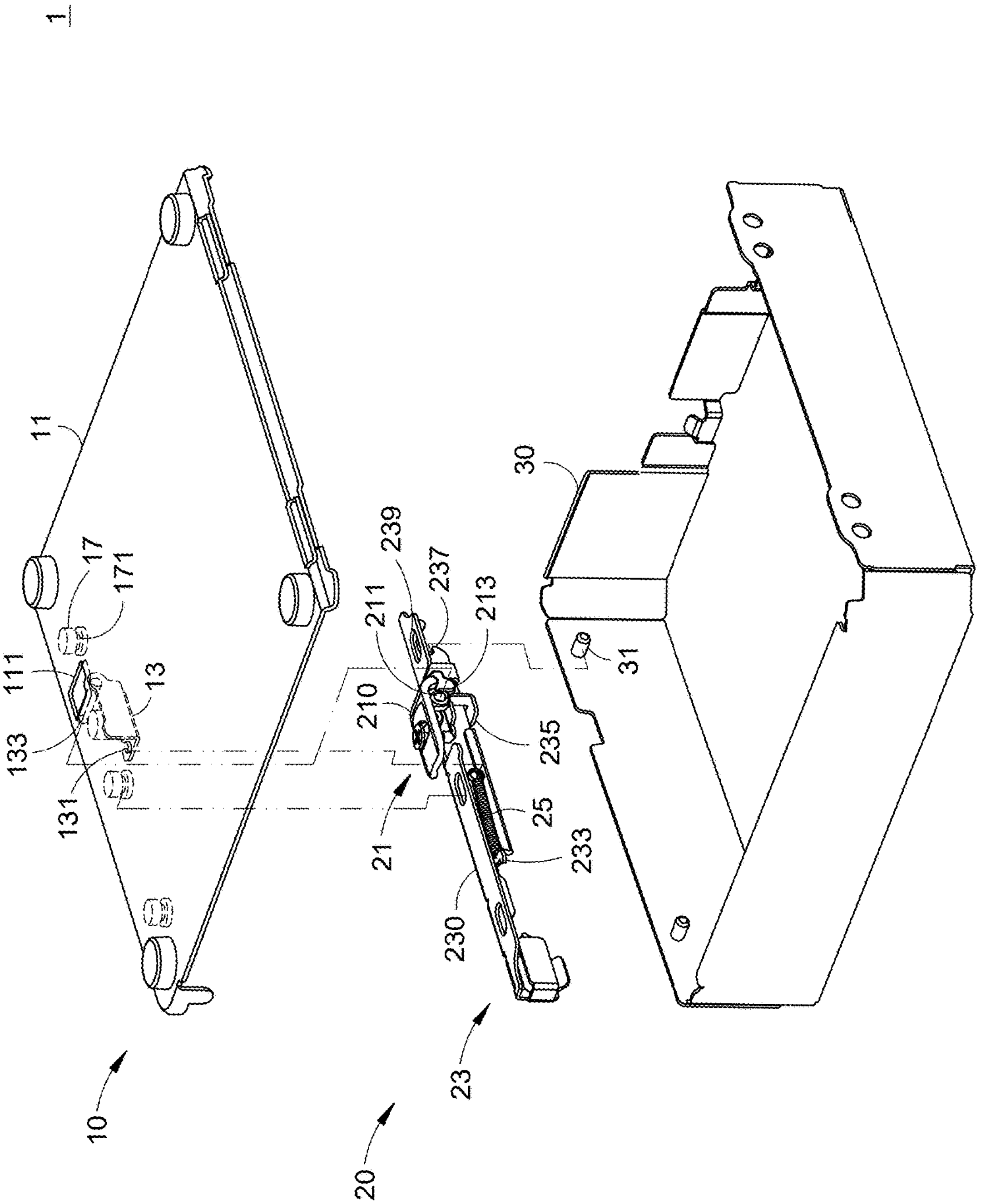
FIG. 1B which is another structure exploded view according to another embodiment of the present application.

Please refer to FIG. 1B, which is an exploded view according to another embodiment of the present application. As shown in the figure, this embodiment is the second embodiment. In the second embodiment, the limit fixing component 17 is disposed adjacent to one side of the pivot shaft 133, and a limit fixing groove 171 is surrounding a side of the limit fixing component 17.

Continued to the above, in the second embodiment, a sliding limit groove 239 is passed through a top surface of the sliding plate body 230. A width of the sliding limit groove 239 corresponds to a diameter of the limit fixing groove 171 surrounded the limit fixing component 17, allowing the sliding limit groove 239 to slide onto the limit fixing component 17.

Please refer again to FIG. 1A and FIG. 1B, as shown in the figures, this embodiment is the third embodiment. In the third embodiment, the limit fixing component 15 is disposed adjacent to a side of the first hook part 131, and the limit fixing component 17 is disposed adjacent to a side of the pivot shaft 133. A side of the limit fixing component 15 is surrounded by a limit fixing groove 151, and a side of the limit fixing component 17 is surrounded by a limit fixing groove 171.

Continued to the above, in the third embodiment, the sliding limit groove 231 is slidably mounted on the limit fastener 15, and the sliding limit groove 239 is slidably mounted on the limit fastener 17.

In summary, the present application provides a quick disassembly structure for computer case, where the toggle pin component pivots clockwise around the pivot hole when pushed outward from the first casing, driving the toggle extension member to move the transmission plate towards the first direction. While the toggle extension member pushes the transmission plate, the limit fastener slides from the left to the right side of the limit fixing groove, the second hook part pulls and stretches the elastic component, and the third hook part separates the tenon in the first direction. This addresses the issue known in computer cases with quick disassembly structures where lateral aging or damage of the push button increases friction, rendering the push button inoperable and preventing the separation of the first and second casings of the computer case.

Therefore, the present application indeed possesses novelty, advancement, and industrial applicability, undoubtedly meeting the patent application requirements of our national patent law. Accordingly, a patent application is hereby legally filed, earnestly praying for the esteemed office to grant the patent at the earliest convenience.

However, the above description is merely an embodiment of the present application and is not intended to limit the scope of the present application. Therefore, all equivalent variations and modifications in shape, structure, features, and spirit as described in the scope of the patent application should be included within the scope of this patent application.

The invention claimed is:

1. A quick disassembly structure for computer case, comprising:

a first casing, comprising:

a cover, including a hole passing through a top surface of the cover;

a first casing fastener, fixed to a bottom surface of the cover and adjacent to the hole, including a first hook part fixed to a side of the first casing fastener and a pivot shaft protruding on another side of the first casing fastener, the pivot shaft disposed below the hole; and a limit fastener, disposed adjacent to a side of the first hook part, including a limit fixing groove surrounding a side of the limit fastener;

a quick disassembly member, comprising:

a toggle pin component, inserted through the hole at a side, the toggle pin component comprising:

a toggle pin component body;

a pivot hole, disposed on a side of the toggle pin component body, the toggle pin component body pivoted to the pivot shaft through the pivot hole; and a toggle extension member, adjacent to the pivot hole and extends along the side of the toggle pin component body;

a sliding plate, disposed adjacent to the bottom surface of the cover, and comprising:

a sliding plate body;

a sliding limit groove, formed on a top surface of the sliding plate body and slides within the limit fastener;

a second hook part, disposed on a side of the sliding plate body;

a transmission plate, extended and fixed to the side of the sliding plate body, corresponding to the toggle extension member; and a third hook part, which is adjacent to the transmission plate and fixed to the side of the sliding plate body; and an elastic component, an end of the elastic component hooked by the first hook part, and another end of the elastic component hooked by the second hook part; and a second casing, a side including a tenon corresponding to the third hook part;

wherein, when the toggle pin component is actuated, the toggle pin component rotates clockwise around the pivot hole as a rotating axis, driving the toggle extension member to push the transmission plate to move toward a first direction; while the toggle extension member pushes the transmission plate, the second hook part pulls and stretches the elastic component, and the third hook part moves toward the first direction to disengage from the tenon, causing the first casing and the quick disassembly structure to separate from the second casing toward a second direction.

2. The quick disassembly structure for computer case of claim 1, wherein the limit fastener is disposed on a side of the pivot shaft.

3. The quick disassembly structure for computer case of claim 1, wherein the first hook part is horizontally aligned with the second hook part.

4. The quick disassembly structure for computer case of claim 1, wherein the toggle pin component is used to pull the first casing when the first casing and the quick disassembly structure separate from the second casing toward the second direction.

5. The quick disassembly structure for computer case of claim 1, wherein a pin fastener is inserted through a top surface of the toggle pin component to secure the toggle pin component.

6. The quick disassembly structure for computer case of claim 1, wherein a corner pillar is disposed on a top surface of the first casing, which is used to support the computer case.

7. The quick disassembly structure for computer case of claim 1, wherein the material of the sliding plate is a steel plate treated by a hot-dip galvanizing treatment.

8. The quick disassembly structure for computer case of claim 1, wherein a side of the third hook part includes a slanted opening, used to align the third hook part with the tenon when the first casing and the quick disassembly member are joined to the second casing toward a opposite direction of the second direction.

9. The quick disassembly structure for computer case of claim 7, wherein after the third hook part is aligned with the tenon, the toggle pin component rotates counterclockwise around the pivot hole as a rotating axis, and the elastic component shrinks, causing the third hook part to hook the tenon.

10. The quick disassembly structure for computer case of claim 1, wherein another side of the second casing is fixed with a second casing fastener, a side of the second casing fastener is fixed with a sleeve, and a side of the cover is fixed with a shaft part, leading the sleeve to be fitted over the shaft part.

11. The quick disassembly structure for computer case of claim 1, wherein another side of the second casing is fixed with a second casing shaft component, a side of the cover includes a cover sleeve, the bottom of the cover is fixed with a cover fixing component, which is aligned with the cover sleeve, and the cover sleeve is fitted over the second casing shaft component.

* * * * *